(12) United States Patent
Elenga et al.

(10) Patent No.: US 11,446,701 B2
(45) Date of Patent: *Sep. 20, 2022

(54) EFFICIENT HAPTIC ACTUATOR

(71) Applicant: Resonant Systems, Inc., Seattle, WA (US)

(72) Inventors: Robin Elenga, Seattle, WA (US); Dan Knodle, Seattle, WA (US); Steven Combest, Gig Harbor, WA (US); Liam O'Brien, Seattle, WA (US); Dave Beecher, Redmond, WA (US); Christopher Howard, Seattle, WA (US)

(73) Assignee: Resonant Systems, Inc., Seattle, WA (US)

( * ) Notice: Subject to any disclaimer, the term of this patent is extended or adjusted under 35 U.S.C. 154(b) by 15 days.

This patent is subject to a terminal disclaimer.

(21) Appl. No.: 16/792,082

(22) Filed: Feb. 14, 2020

(65) Prior Publication Data
US 2020/0282425 A1   Sep. 10, 2020

Related U.S. Application Data

(63) Continuation of application No. 15/986,646, filed on May 22, 2018, now Pat. No. 10,562,067.
(Continued)

(51) Int. Cl.
*B06B 1/04* (2006.01)
*G06F 3/01* (2006.01)
(Continued)

(52) U.S. Cl.
CPC .............. *B06B 1/045* (2013.01); *G06F 3/016* (2013.01); *H01L 41/09* (2013.01); *B06B 3/00* (2013.01); *H02K 7/063* (2013.01)

(58) Field of Classification Search
CPC ........... B06B 1/045; B06B 3/00; G06F 3/016; H01L 41/09; H02K 7/063
(Continued)

(56) References Cited

U.S. PATENT DOCUMENTS

2004/0256930 A1   12/2004   Kim
2006/0274035 A1   12/2006   Bailey et al.
(Continued)

FOREIGN PATENT DOCUMENTS

KR   20200015579 A   2/2020
WO   WO-2018217796 A1   11/2018

*Primary Examiner* — Muhammad S Islam
*Assistant Examiner* — Zemenay T Truneh
(74) *Attorney, Agent, or Firm* — Theodore M. Magee; Westman, Champlin & Koehler, P.A.

(57) ABSTRACT

The current document is directed to non-linear haptic actuators that use a rotor, rotor-suspension, and spring subsystem to efficiently generate vibrational forces in various types of devices and appliances in which the non-linear haptic actuators are incorporated. Non-linear haptic actuators can be designed and manufactured to be more space efficient than unbalanced-electric-motor and linear-resonant vibration modules and, because most of the frictional forces produced in unbalanced-electric-motor and linear-resonant vibration modules are eliminated from non-linear haptic actuators, non-linear haptic actuators are generally more power efficient and robust than unbalanced-electric-motor and linear-resonant vibration modules.

16 Claims, 16 Drawing Sheets

Related U.S. Application Data

(60) Provisional application No. 62/509,644, filed on May 22, 2017.

(51) Int. Cl.
    *H02K 7/06*     (2006.01)
    *H01L 41/09*    (2006.01)
    *B06B 3/00*     (2006.01)

(58) Field of Classification Search
    USPC .......................................................... 318/114
    See application file for complete search history.

(56) References Cited

U.S. PATENT DOCUMENTS

| | | |
|---|---|---|
| 2014/0018713 A1 | 1/2014 | Elenga et al. |
| 2016/0144404 A1* | 5/2016 | Houston ................ H02K 33/00 318/114 |
| 2017/0216885 A1 | 8/2017 | Takeda et al. |
| 2018/0333748 A1 | 11/2018 | Elenga et al. |

* cited by examiner

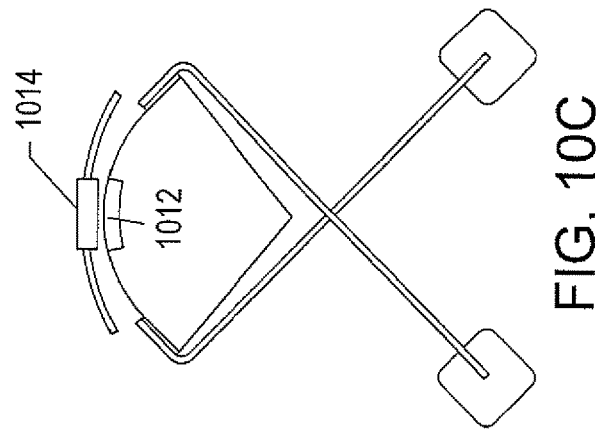
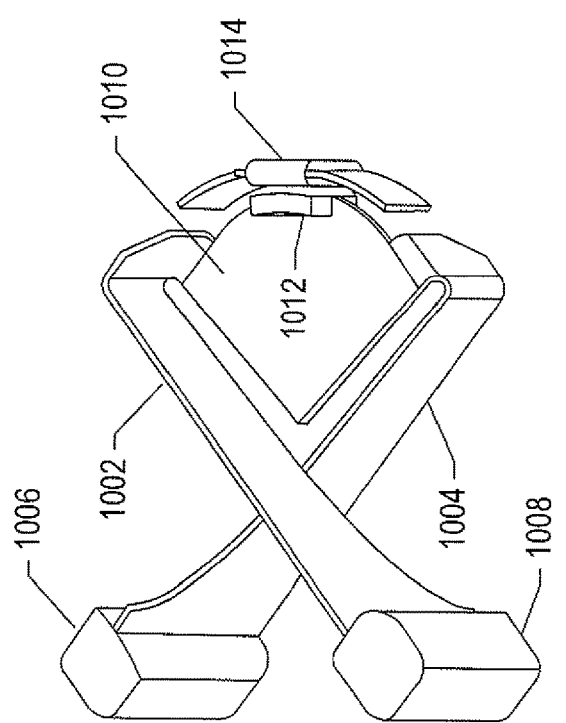
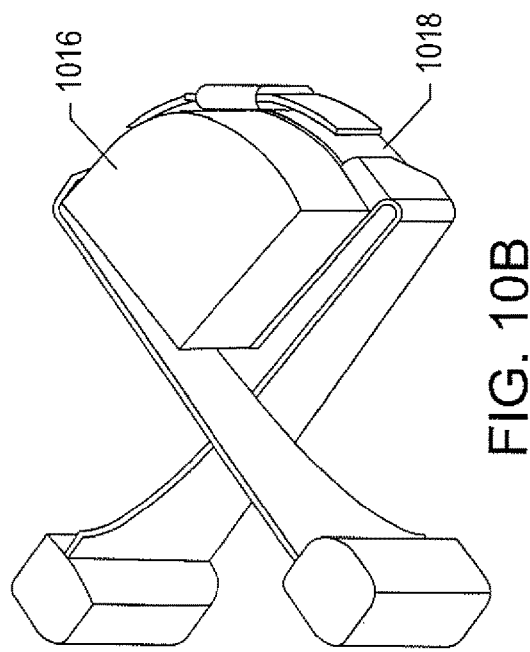
FIG. 10C
FIG. 10A
FIG. 10B

EFFICIENT HAPTIC ACTUATOR

PRIORITY AND CROSS-REFERENCES TO RELATED APPLICATIONS

This application is a continuation of and claims the benefit of priority to co-owned U.S. patent application Ser. No. 15/986,646 entitled "EFFICIENT HAPTIC ACTUATOR", filed May 22, 2018, issuing as U.S. Pat. No. 10,562,067 on Feb. 18, 2020, which claims the benefit of priority to co-owned U.S. Provisional Application Ser. No. 62/509,644 entitled "HIGH PERFORMANCE HAPTIC ACTUATORS", filed May 22, 2017, each of which is incorporated by reference herein in its entirety.

TECHNICAL FIELD

The current document is directed to vibration-generating devices and, in particular, to vibration modules that can be incorporated into a wide variety of different types of electromechanical devices, appliances, and systems to produce haptic signals, facilitate device operation, and for other purposes.

BACKGROUND

Vibration-inducing motors and mechanisms have been used for many years in a wide variety of different consumer appliances, toys, and other devices and systems. Examples include vibration signals generated by smart phones and pagers, vibration-driven appliances, such as hair-trimming appliances, electric toy football games, and many other appliances, devices, and systems. The most common electromechanical system used for generating vibrations is an intentionally unbalanced electric motor. While effective in producing vibrations, there are many problems associated with unbalanced-electric-motor vibration-generating units, including reliability issues and short useful lifetimes, poor power efficiencies, constrained vibrational modes, and an inability to produce varied vibrational forces and frequencies. Linear-resonant vibration modules ("LRVMs") address certain of these problems, but are also associated with problems and deficiencies, including spatial inefficiencies, non-optimal power-to-vibrational-force efficiencies, and manufacturing challenges. Because of the above-discussed disadvantages and problems associated with the commonly employed types of vibration-generation units, designers, manufacturers, and, ultimately, users of a wide variety of different vibration-based devices, appliances, and systems continue to seek more efficient and capable vibration-generating units for incorporation into many consumer appliances, devices, and systems.

SUMMARY

The current document is directed to non-linear haptic actuators that use a rotor, rotor-suspension, and spring subsystem to efficiently generate vibrational forces in various types of devices and appliances in which the non-linear haptic actuators are incorporated. Non-linear haptic actuators can be designed and manufactured to be more space efficient than unbalanced-electric-motor and linear-resonant vibration modules and, because most of the frictional forces produced in unbalanced-electric-motor and linear-resonant vibration modules are eliminated from non-linear haptic actuators, non-linear haptic actuators are generally more power efficient and robust than unbalanced-electric-motor and linear-resonant vibration modules.

BRIEF DESCRIPTION OF THE DRAWINGS

FIGS. 10A-C illustrate one implementation of the unbalanced rotor, rotor suspension, and spring mechanism used in the currently disclosed NLHA.

DETAILED DESCRIPTION

Figure 1A:
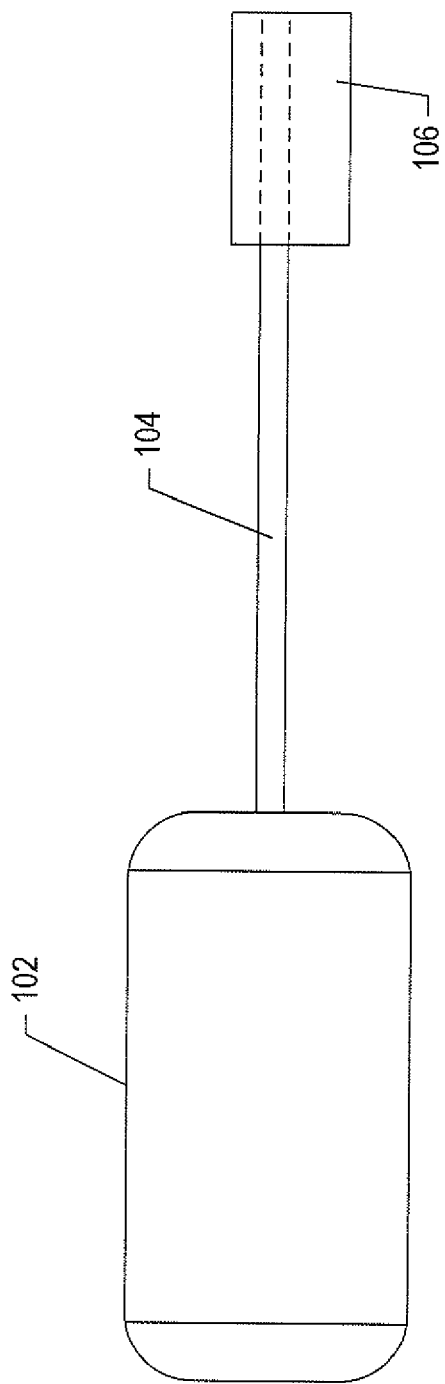
FIGS. 1A-B illustrate an unbalanced electric motor typically used for generating vibrations in a wide variety of different devices.
Figure 1B:
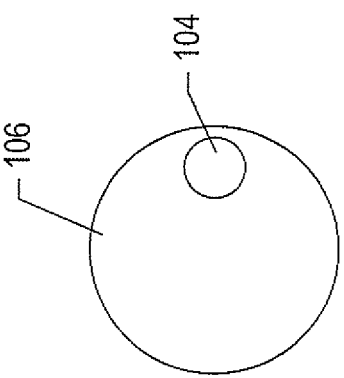
Figure 2A:
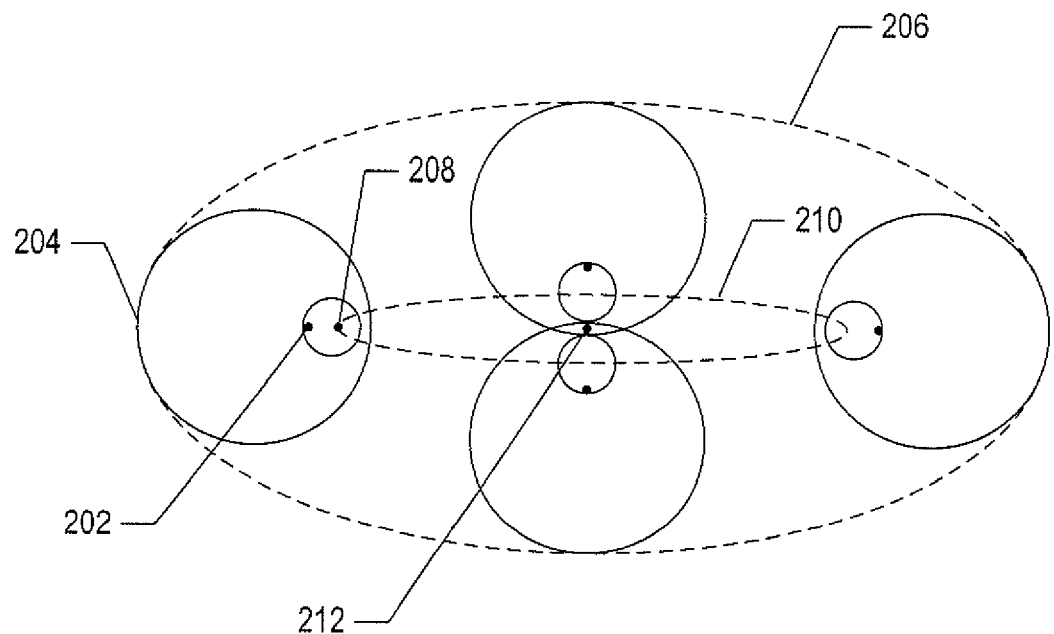
FIGS. 2A-B illustrate the vibrational motion produced by the unbalanced electric motor shown in FIGS. 1A-B.
Figure 2B:
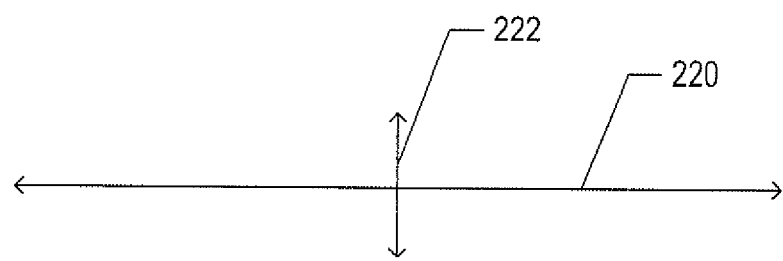

FIGS. 1A-B illustrate an unbalanced electric motor typically used for generating vibrations in a wide variety of different devices. As shown in FIG. 1A, a small, relatively low-power electric motor 102 rotates a cylindrical shaft 104 onto which a weight 106 is asymmetrically or mounted. FIG. 1B shows the weight asymmetrically mounted to the shaft, looking down at the weight and shaft in the direction of the axis of the shaft. As shown in FIG. 1B, the weight 106 is mounted off-center on the electric-motor shaft 104. FIGS. 2A-B illustrate the vibrational motion produced by the unbalanced electric motor shown in FIGS. 1A-B. As shown in FIGS. 2A-B, the asymmetrically-mounted weight creates an elliptical oscillation of the end of the shaft, normal to the shaft axis, when the shaft is rotated at relatively high speed by the electric motor. FIG. 2A shows displacement of the weight and shaft from the stationary shaft axis as the shaft is rotated, looking down on the weight and shaft along the shaft axis, as in FIG. 1B. In FIG. 2A, a small mark 202 is provided at the periphery of the disk-shaped end the of electric-motor shaft to illustrate rotation of the shaft. When the shaft rotates at high speed, a point 204 on the edge of the weight traces an ellipsoid 206 and the center of the shaft 208 traces a narrower and smaller ellipsoid 210. Were the shaft balanced, the center of the shaft would remain at a position 212 in the center of the diagram during rotation, but the presence of the asymmetrically-mounted weight attached to the shaft, as well as other geometric and weight-distribution characteristics of the electric motor, shaft, and unbalanced weight together create forces that move the end of the shaft along the elliptical path 210 when the shaft is rotated at relatively high speed. The movement can be characterized, as shown in FIG. 2B, by a major axis 220 and minor axis 222 of vibration, with the direction of the major axis of vibration equal to the direction of the major axis of the ellipsoids, shown in FIG. 2A, and the length of the major axis corresponding to the amplitude of vibration in this direction. In many cases, the path along which the end of the shaft moves is closer to a circle than an ellipse, but, for purposes of illustration, the eccentricity of the elliptical path is greatly exaggerated, in FIG. 2A.

In many applications, in which a linear oscillation is desired, designers seek to force the major-axis-amplitude/minor-axis-amplitude ratio to be as large as possible, but, because the vibration is produced by a rotational force, it is generally not possible to achieve linear oscillation. In many cases, the path traced by the shaft center may be close to circular. The frequency of vibration of the unbalanced electric motor is equal to the rotational frequency of the electric-motor shaft and is therefore constrained by the rate at which the motor can rotate the shaft. At low rotational speeds, little vibration is produced. As mentioned above, unbalanced electric motors generally have relatively short useful lifetimes and cannot be used to produce ranges of vibrational forces and frequencies desired for many applications.

Various types of linear-resonant vibration modules ("LRVMs") are currently used to generate vibrational forces in various different types of appliances, devices, and systems. The linear nature of LRVM vibration-inducing motion allows certain of the problems associated with unbalanced-electric-motor vibrators, discussed above, to be addressed. An oscillating linear motion does not produce destructive forces that quickly degrade and wear out an unbalanced electric motor. A linearly oscillating mechanism is characterized by parameters that can be straightforwardly varied in order to produce vibrations of a desired amplitude and frequency over a very broad region of amplitude/frequency space. Linear oscillation within a LRVM translates into highly direction vibrational forces produced by an appliance or device that incorporates the LRVM.

FIGS. 3A-G illustrate one particular LRVM, and operation of the particular LRVM. FIGS. 3A-G all use the same illustration conventions, next discussed with reference to FIG. 3A. The LRVM includes a cylindrical housing 302 within which a solid, cylindrical mass 304, or weight, can move linearly along the inner, hollow, cylindrically shaped chamber 306 within the cylindrical housing or tube 302. The weight is a magnet, in certain implementations, with polarity indicated by the "+" sign 310 on the right-hand end and the "−" sign 312 on the left-hand end of the weight 304. The cylindrical chamber 306 is capped by two magnetic disks 314 and 316 with polarities indicated by the "+" sign 318 and the "−" sign 319. The disk-like magnets 314 and 318 are magnetically oriented opposite from the magnetic orientation of the weight 304, so that when the weight moves to either the extreme left or extreme right sides of the cylindrical chamber, the weight is repelled by one of the disk-like magnets at the left or right ends of the cylindrical chamber. In other words, the disk-like magnets act much like springs, to facilitate deceleration and reversal of direction of motion of the weight and to minimize or prevent mechanical-impact forces of the weight and the end caps that close off the cylindrical chamber. Finally, a coil of conductive wire 320 girdles the cylindrical housing, or tube 302 at approximately the mid-point of the cylindrical housing.

Figure 3A:
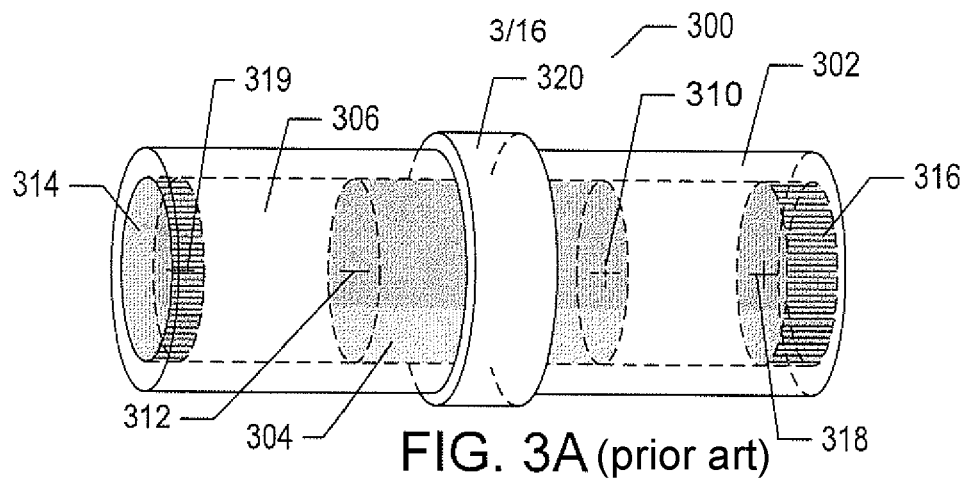
FIGS. 3A-G illustrate one particular LRVM, and operation of the particular LRVM.
Figure 3B:
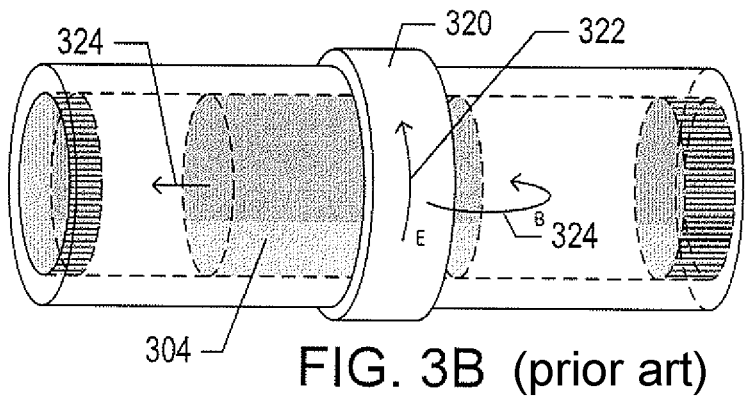
Figure 3C:
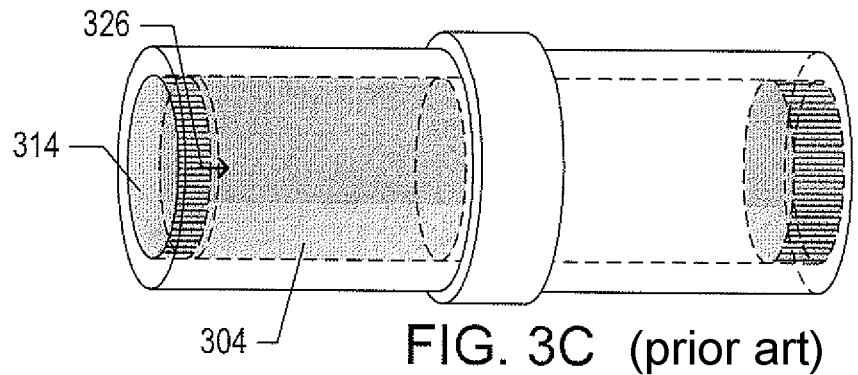
Figure 3D:
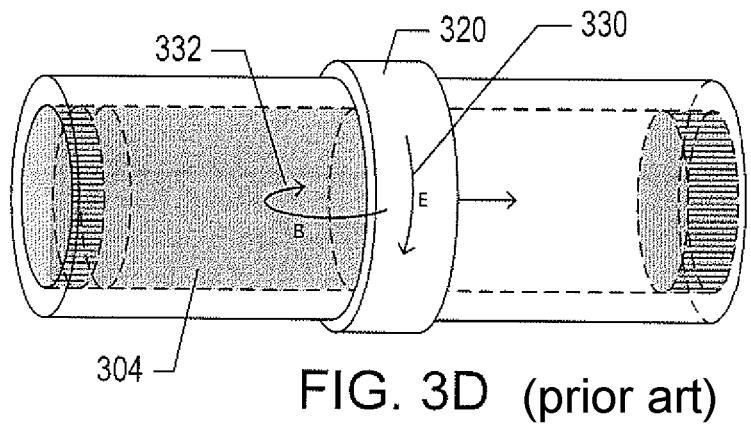
Figure 3E:
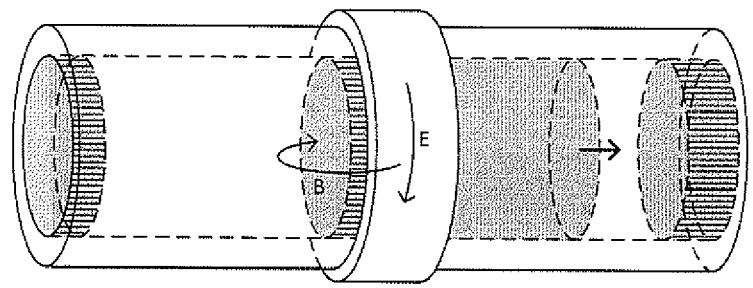
Figure 3F:
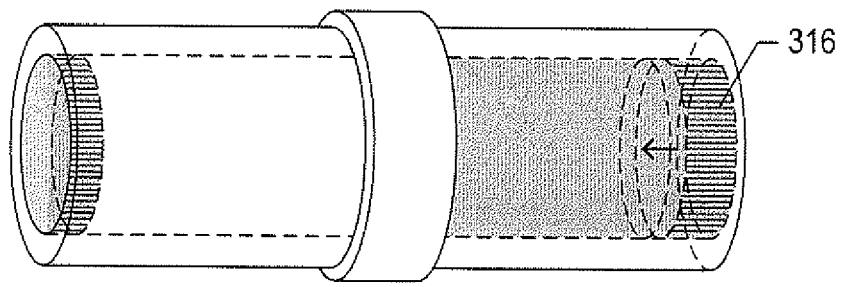
Figure 3G:
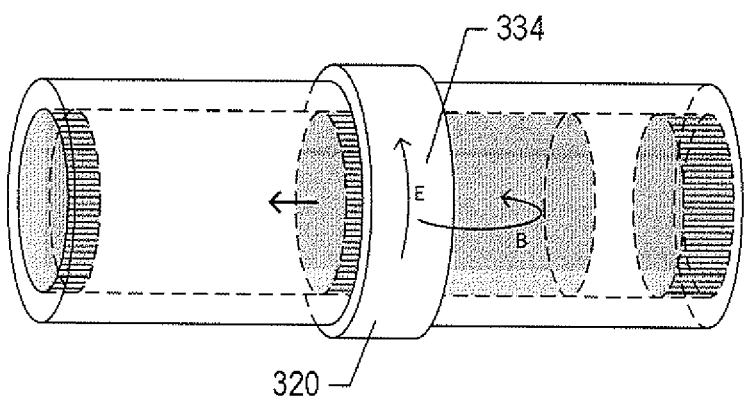

FIGS. 3B-G illustrate operation of the LRVM shown in FIG. 3A. When an electric current is applied to the coil 320 in a first direction 322, a corresponding magnetic force 324 is generated in a direction parallel to the axis of the cylindrical chamber, which accelerates the weight 304 in the direction of the magnetic force 324. When the weight reaches a point at or close to the corresponding disk-like magnet 314, as shown in FIG. 3C, a magnetic force due to the repulsion of the disk-like magnet 314 and the weight 304, 326, is generated in the opposite direction, decelerating the weight and reversing its direction. As the weight reverses direction, as shown in FIG. 3D, current is applied in an opposite direction 330 to the coil 320, producing a magnetic force 332 in an opposite direction from the direction of the magnetic force shown in FIG. 3B, which accelerates the weight 304 in a direction opposite to the direction in which the weight is accelerated in FIG. 3B. As shown in FIG. 3E, the weight then moves rightward until, as shown in FIG. 3F, the weight is decelerated, stopped, and then accelerated in the opposite direction by repulsion of the disk-like magnet 316. An electrical current is then applied to the coil 320 in the same direction 334 as in FIG. 3B, again accelerating the solid cylindrical mass in the same direction as in FIG. 3B. Thus, by a combination of a magnetic field with rapidly reversing polarity, generated by alternating the direction of current applied to the coil, and by the repulsive forces between the weight magnet and the disk-like magnets at each end of the hollow, cylindrical chamber, the weight linearly oscillates back and forth within the cylindrical housing 302, imparting a direction force at the ends of the cylindrical chamber with each reversal in direction.

There are many types and configurations of LRVMs, including implementations that include a disk-shaped spring and a disk-shaped voice coil under a disk-shaped moving mass to which drive magnets are affixed. In other implementations, the coil is printed on a printed circuit board and drives a cylindrical moving mass back and forth in a direction orthogonal to the plane of the printed circuit board.

As discussed above, while often better suited for haptic applications than unbalanced electric motors, LRVMs nonetheless associated with a variety of deficiencies and problems. In many applications, LRVMs are dimensionally awkward, having dimensions along the linear-oscillation axis significantly greater than along dimensions orthogonal to that axis, resulting in challenges in fitting the LRVMs into devices and applications in which miniaturization is a major goal. LRVMs produce linear oscillation that is useful in many applications, but in those applications in which more general vibrational patterns are desired, multiple LRVMs may be needed, further exacerbating space-efficiency problems associated with LRVMs. LRVMs, such as the LRVM described above and illustrated in FIGS. 3A-G, include surfaces that are in contact with one another and that, during oscillation, move relative to one another, creating significant amounts of friction, in turn decreasing the efficiency in power-to-vibrational-force conversion by LRVMs and representing a significant source of wear and tear, dust and vapor generation, and heat generation.

Figure 4A:
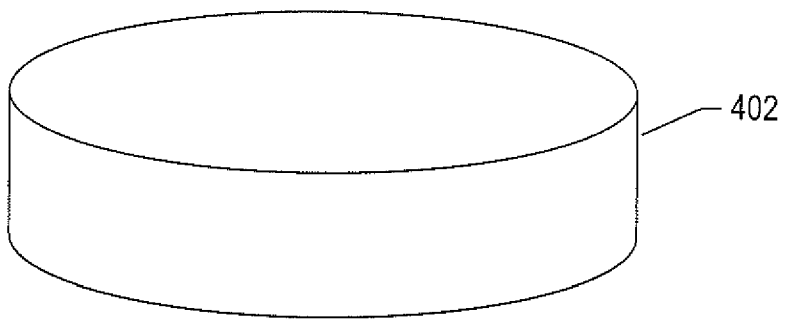
FIGS. 4A-D illustrate the general concept of the currently disclosed non-linear haptic actuator ("NLHA").
Figure 4B:
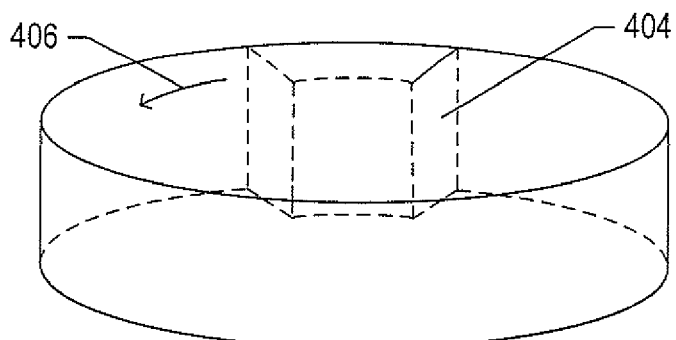
Figure 4C:
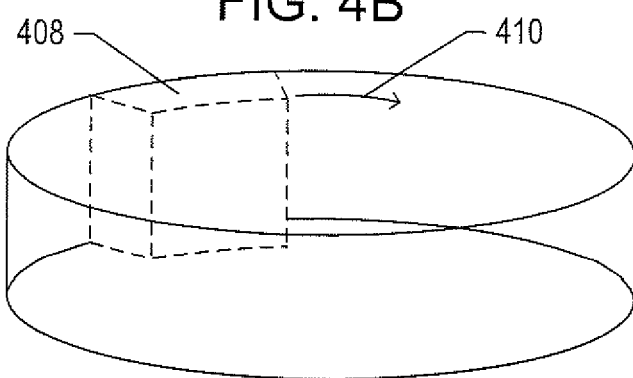
Figure 4D:
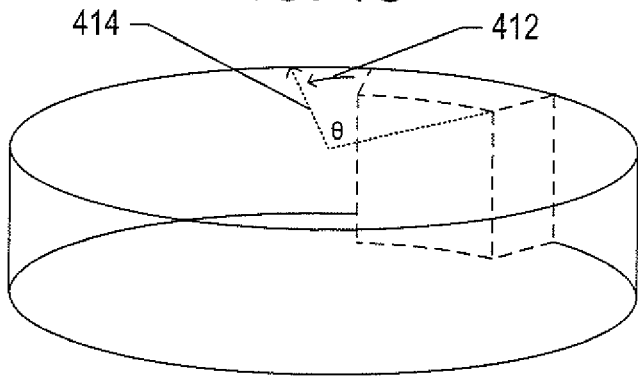

The current document is directed to a new type of vibration-generation module that addresses the deficiencies and problems of unbalanced electric motors and LRVMs, discussed above. FIGS. 4A-D illustrate the general concept of the currently disclosed non-linear haptic actuator ("NLHA"). A NLHA, viewed from an exterior vantage point, appears to be a simple housing, such as the housing 402 shown in FIG. 4A. In FIG. 4A, the housing is cylindrically shaped, but housings of various different types of shapes, from rectangular box-like shapes to various types of asymmetric-cross-section cylinders and even irregular shapes may be used in different applications for different purposes. FIGS. 4B-C illustrate a moving element within the housing. In FIG. 4B, the moving element 404 is in a centered position, with arrow 406 indicating the direction in which the moving element is currently moving. In FIG. 4C, the moving element 408 has reached an extreme position to the left of the centered position shown in FIG. 4B and begins to move in the opposite direction, indicated by arrow 410. In FIG. 4D, the moving element has reached an extreme position to the right of the center position shown in FIG. 4B and begins to move back towards the center position, as indicated by arrow 412. The moving element 404 therefore oscillates back-and-forth along an arc that subtends the angle θ 414, shown in FIG. 4D. It is for this reason that the vibration module 402 is referred to as being non-linear. The moving element have various different shapes and sizes. As discussed below, for efficiency, the moving element is suspended within the housing so that the moving element oscillates along an arc without contacting the housing and without rigid-surface-to-rigid-surface contacts with components of the NLHA other than the suspension subsystem, removing most of the frictional forces inherent in unbalanced-electric-motor and linear resonant vibration modules.

Figure 5B:
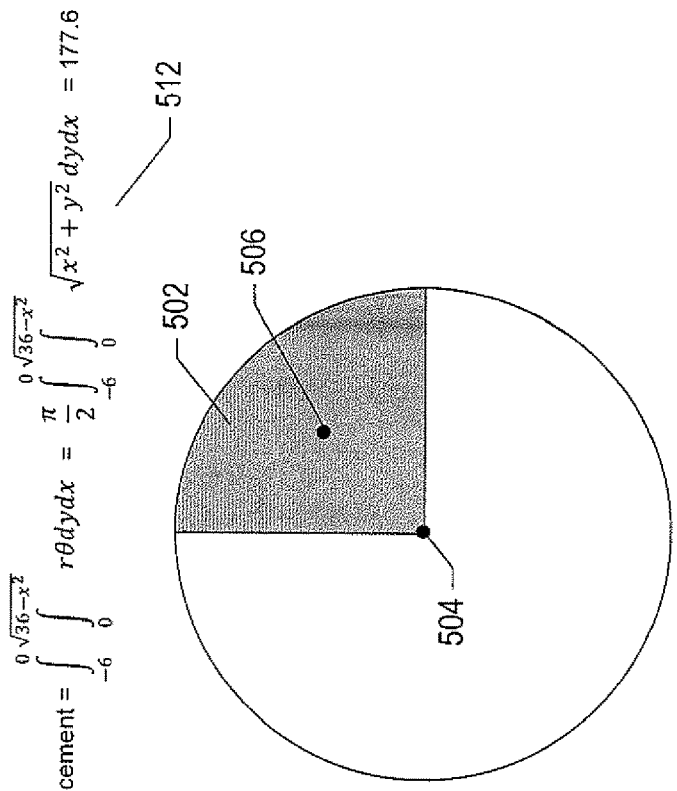
FIGS. 5A-D illustrate space efficiency of an NLHA.
Figure 5A:
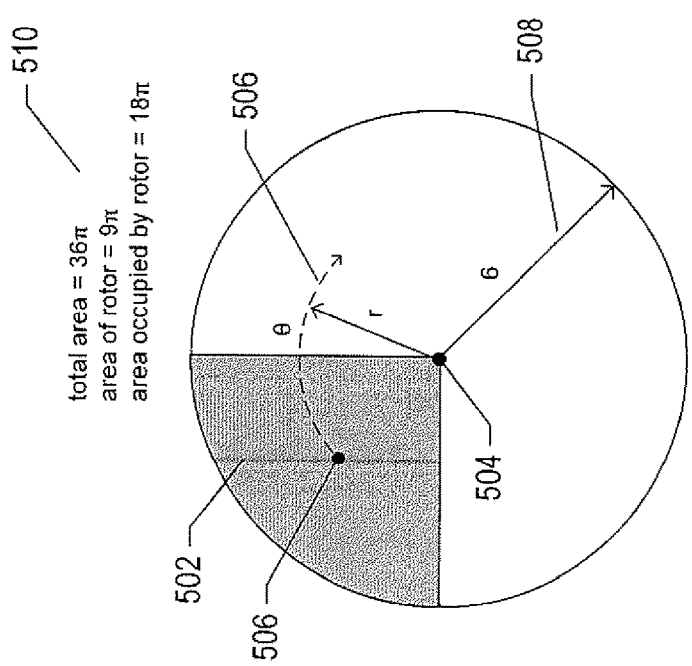
Figure 5C:
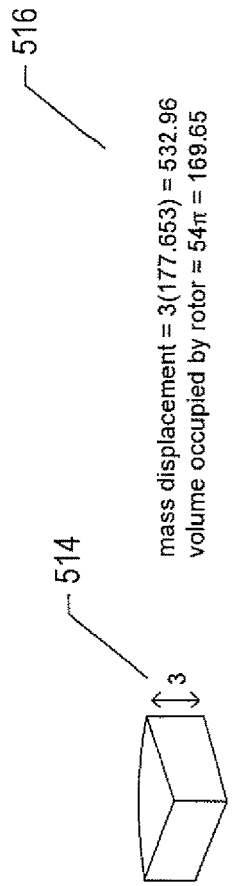
Figure 5D:
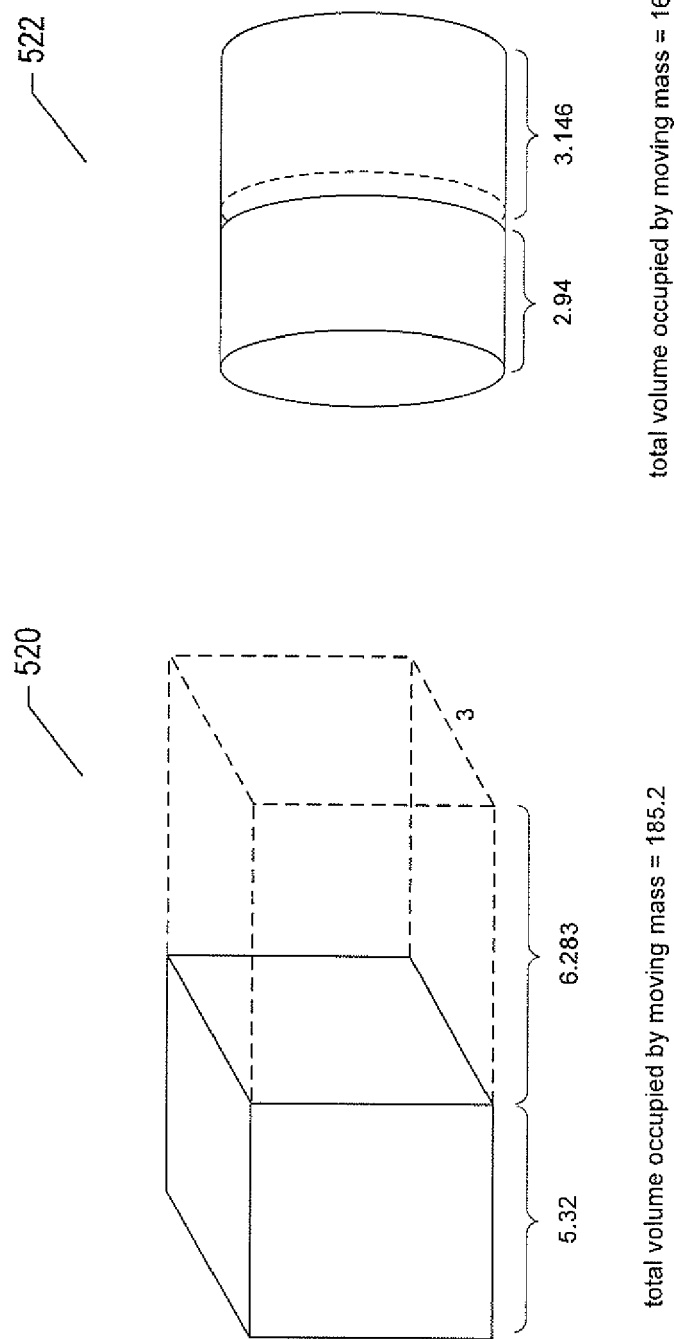

FIGS. 5A-D illustrate space efficiency of an NLHA. FIGS. 5A-B represent a view, from a top-down perspective, of an NLHA similar to the NLHA shown in FIGS. 4B-D. In FIG. 5A, a wedge-shaped moving element 502 is shown at the left-most extreme position and, in FIG. 5B, the wedge-shaped moving element 502 is shown at the right-most extreme position. The wedge-shaped moving element 502 rotates about a central point 504 and oscillates along an arc that subtends the angle θ 506, which has the numeric value π/2 for the example shown in FIG. 5A. Point 506 within the wedge-shaped moving element, for example, rotates from a first position shown in FIG. 5A to the second position shown in FIG. 5B during the clockwise motion of the first part of one oscillation cycle. Given that the radius of the housing has the numeric value 6 (508 in FIG. 5 A), the total area of the disk-shaped cross-section of the housing is 36π, the area of the wedge-shaped moving element, or rotor, is 9π, and the area occupied by the rotor during back-and-forth oscillation is 18π (510 in FIG. 5A. Integrating the mass of each point in the wedge-shaped moving element times the distance traveled by the point during the clockwise motion in one oscillation cycle, illustrated in FIGS. 5A-B, as indicated by expression 512 in FIG. 5B, provides a numerical value, 177.653, representing the total mass displacement during a forward rotation corresponding to one half of an oscillation period. When the thickness of the wedge-shaped moving element, or rotor, has a numeric value 3 (514 in FIG. 5C), the computed mass displacement is 532.96 and the computed volume occupied by the rotor is 169.65 (516 in FIG. 5C). As shown in FIG. 5D, similar moving-massive volumes can be obtained for rectangular-cross-section 520 and circular-cross-section 522 LRVMs. However, as discussed above, the LRVMs use springs at each end of the linear oscillation path, significantly increasing the length of the LRVM and generally increasing the dimensional asymmetry of the LRVM. Furthermore, the oscillation path may need to be significantly lengthened in order to increase the time during which the magnetic force can be applied to the moving mass in order to generate sufficient velocity of the moving mass, since acceleration of the moving mass is significantly inhibited by frictional forces. As discussed below, in the currently disclosed implementation of the NLHA, the rotor does not contact the housing, as a result of which most of the frictional forces associated with moving the rotor are eliminated. Provided that the spring mechanism for the NLHA can be space-efficiently packaged within the housing, the NLHA can be significantly more compactly designed and manufactured than an LRVM that produces similar vibrational forces.

Figure 6:
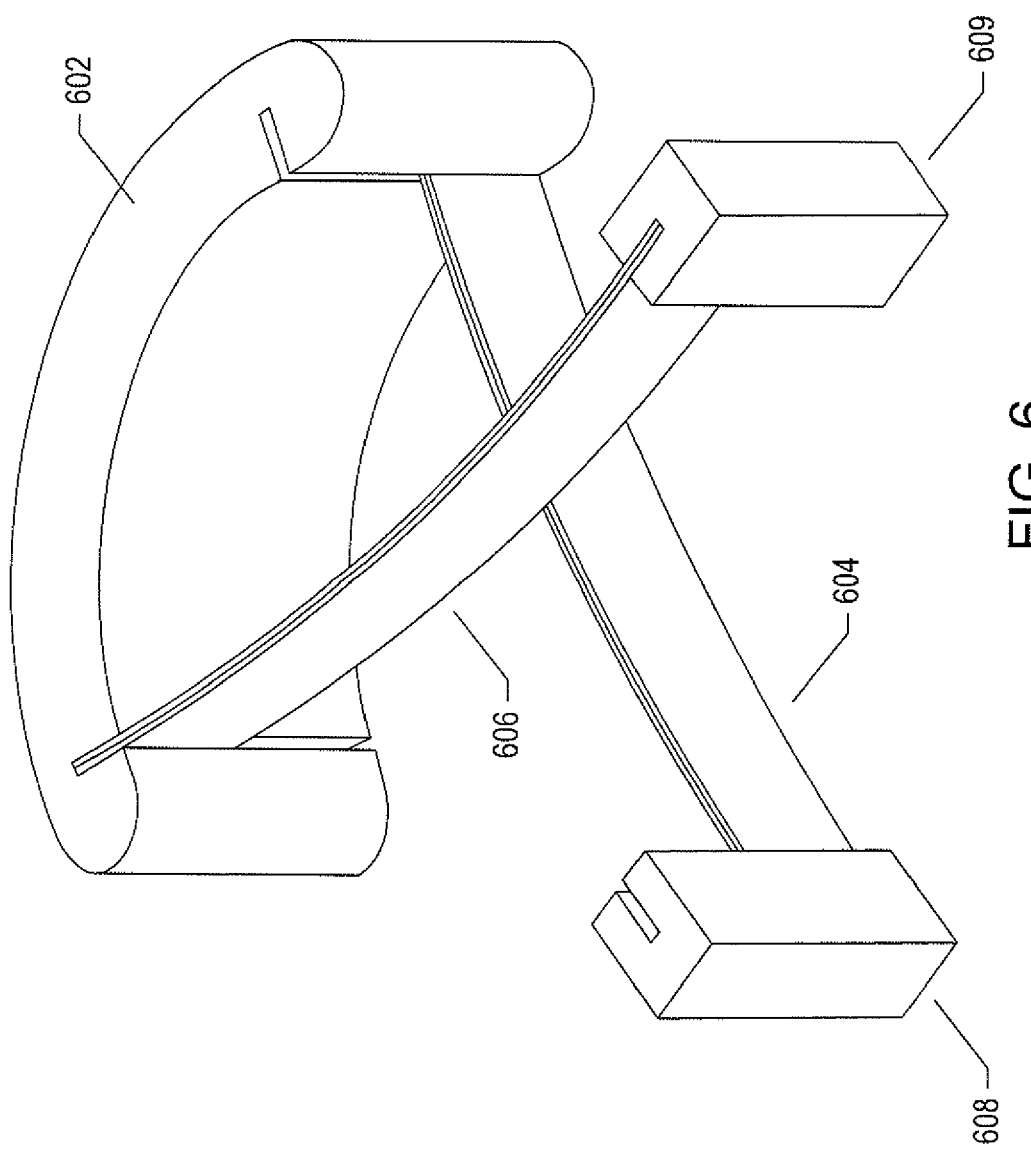
FIG. 6 illustrates an unbalanced rotor, rotor suspension, and spring mechanism.

FIG. 6 illustrates an unbalanced rotor, rotor suspension, and spring mechanism. The rotor 602 is suspended in air, above a surface, such as the bottom of the housing, by a first spring 604 and a second spring 606. Each spring is securely attached to the rotor, at one end, and securely attached to a spring mount 608-609, at the other end. Spring 604, for example, is securely attached to spring mount 608, at one end, and to the rotor 602 at the other end. Spring 606 is attached to the rotor, at one end, and to spring mount 609, at the other end. The widths of the two springs are each less than half the width of the rotor, so that they can be vertically stacked, as shown in FIG. 6, with adequate remaining clearance between spring 604 and the underlying surface and between spring 604 and spring 606. During oscillation, discussed below, the two springs do not contact one another, so that, unlike in an LRVM, there are no surface-to-surface contacts producing frictional forces. Because the rotor is asymmetric with respect to a circle that includes an arc-shaped path along with the rotor oscillates, as discussed below, the rotor oscillation produces unbalanced vibrational forces and the rotor, rotor suspension, and spring mechanism is referred to as being "unbalanced."

The Bendix flex pivot has a configuration reminiscent of the rotor, rotor suspension, and spring mechanism illustrated in FIG. 6. The Bendix flex pivot, typically used in low-friction hinges, has been used in a variety of different electromechanical devices. However, in these applications, the Bendix flex pivot is generally balanced and designed to minimize vibration and, most importantly, the rotor is mechanically coupled to a linkage through which mechanical forces are imparted to additional moving components of the devices. As farther discussed below, the currently disclosed NLHA employs a rotor, rotor suspension, and spring mechanism is unbalanced and designed to maximize vibrational forces produced by oscillation of the rotor. Furthermore, the Bendix flex pivot is generally not designed for resilience to the types of vibrational force produced by the currently disclosed rotor, rotor suspension, and spring mechanism, discussed below with reference to FIG. 7A-8C.

Figure 7A:
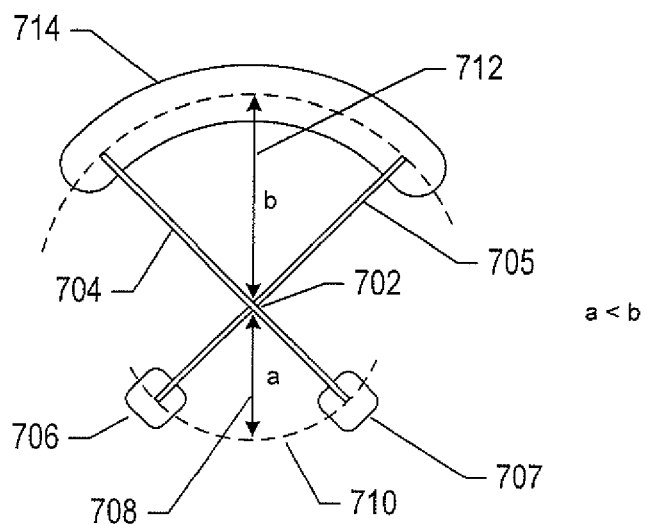
FIGS. 7A-8C illustrate one implementation of an unbalanced rotor, rotor suspension, and spring mechanism used in the currently disclosed NLHA.

FIGS. 7A-8C illustrate one implementation of an unbalanced rotor, rotor suspension, and spring mechanism used in the currently disclosed NLHA. In the unbalanced rotor, rotor suspension, and spring mechanism illustrated in FIG. 6, the crossover point between the two springs lies at the center of a circle through the centers of the curved rotor and the two spring mounts. By contrast, as shown in FIG. 7A, in an alternative configuration, the rotor, rotor suspension, and spring mechanism features a crossover point 702 of the two springs 704 and 705 that is significantly lowered towards the two spring mounts 706-707. Thus, the distance 708 from the crossover point 702 to arc 710 connecting the two spring mounts, a, may be significantly smaller than the distance 712 between the rotor 714 and the crossover point 702, b. However, in yet additional implementations, a may be greater than or equal to b. The ratio a/b is one design parameter that can be adjusted to alter the operational characteristics and behaviors of an NLHA. An off-center crossover point may introduce additional asymmetry, or lack of balance, in an unbalanced rotor, rotor suspension, and spring mechanism used in certain implementations of the currently disclosed NLHA that may contribute to production of desired vibrational forces. In many implementations, the arc-shaped path along which the rotor moves subtends an angle of between 30° and 70°, but larger and smaller angles may be achieved by varying design and implementation parameters.

Figure 7B:
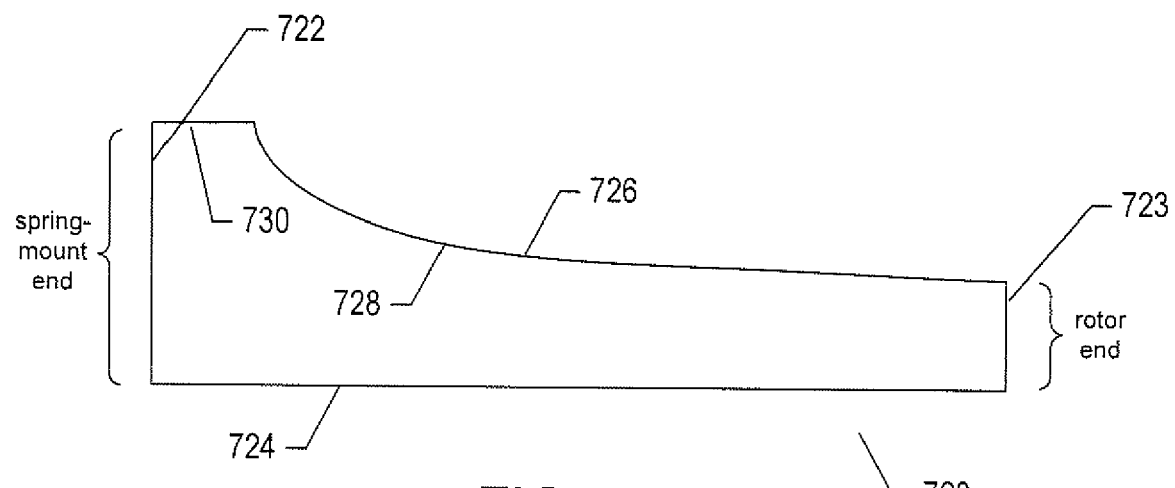

As shown in FIG. 7B, the rotor, rotor suspension, and spring mechanism used in the currently disclosed NLHA employs springs with a very different profile than those encountered in a typical Bendix flex pivot. In the Bendix flex pivot, the springs have rectangular profiles, with two pairs of parallel edges. By contrast, in the rotor, rotor suspension, and spring mechanism used in the currently disclosed NLHA, each spring 720 has an asymmetric profile that includes a pair of approximately parallel edges 722-723 of different lengths, a longer edge 724 orthogonal to the pair of approximately parallel edges, and a fourth edge 726 with a relatively long curved section 728 and a short linear section 730. The currently employed springs with asymmetric profiles provide greater strength and resilience with respect to the large forces imparted to the springs during rotor oscillation. Again, there are many different possible asymmetric spring profiles, but the springs used in the currently disclosed NLHA are characterized by asymmetric shapes that move concentrated oscillation-induced stress away from the edge 722 proximal to the spring mount and distribute the stress more uniformly across the spring, increasing operational resilience and robustness.

Figure 8A:
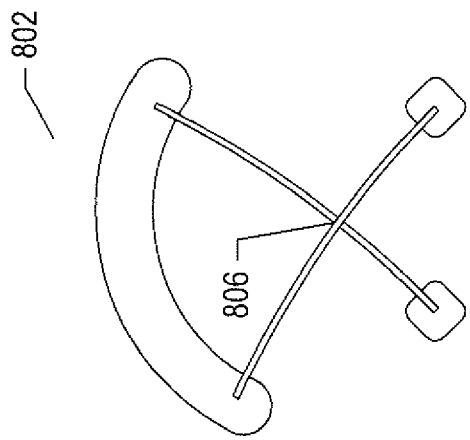
Figure 8A:
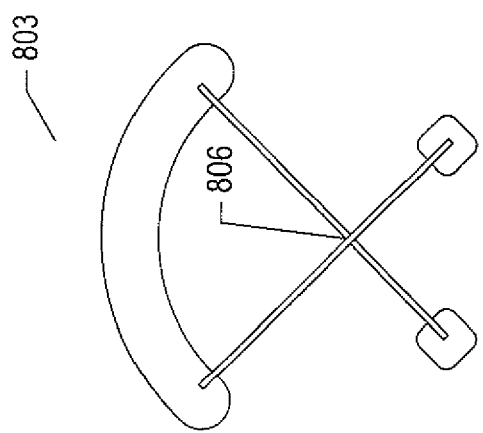
Figure 8A:
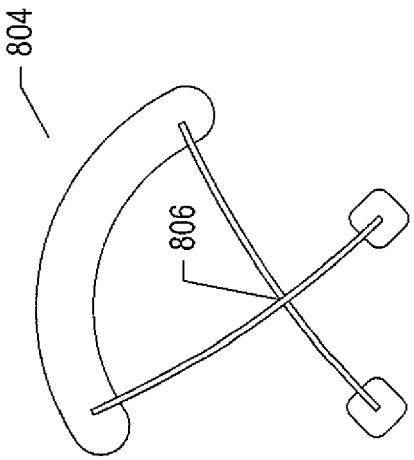
Figure 8B:
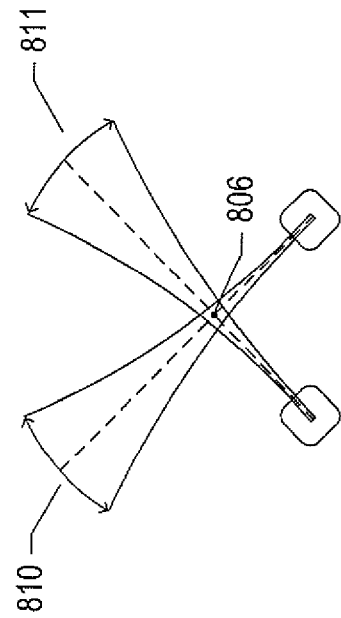
Figure 8C:
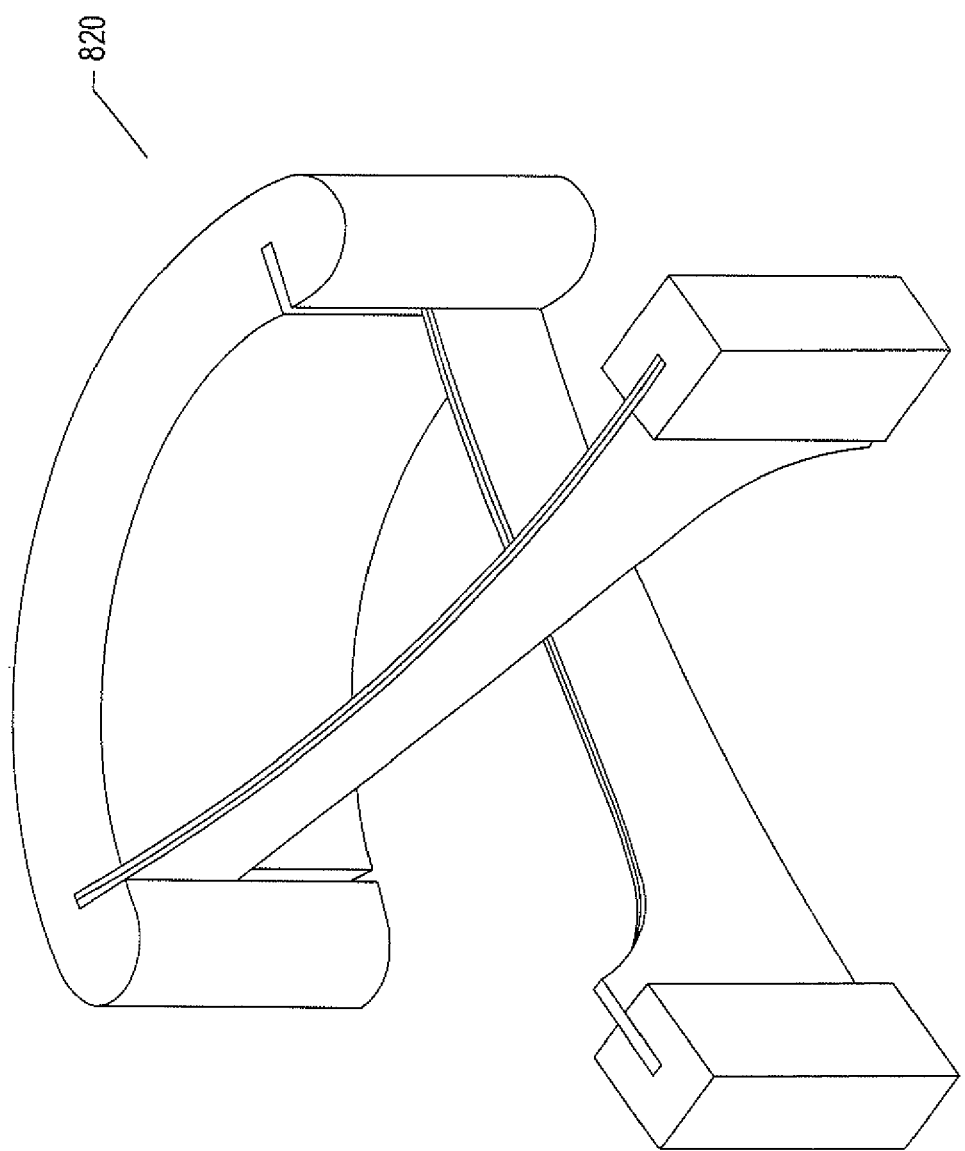

FIGS. 8A-C illustrate an unbalanced rotor, rotor suspension, and spring mechanism used in the currently disclosed NLHA. In FIG. 8A, the three illustrated rotor positions 802-804 corresponding to moving-element positions 408, 406, and 414, respectively, shown in FIGS. 4B-C. As can be seen in FIG. 8A, the rotor oscillates in an arc about the crossover point 806 of the two springs. FIG. 8B illustrates the two arcs 810-11 over which the left-hand and right-hand ends of the rotor, respectively, oscillate. FIG. 8C shows a perspective view of the rotor, rotor suspension, and spring mechanism 820 employed in the currently disclosed NLHA using the same illustration conventions used in FIG. 6.

Figure 9A:
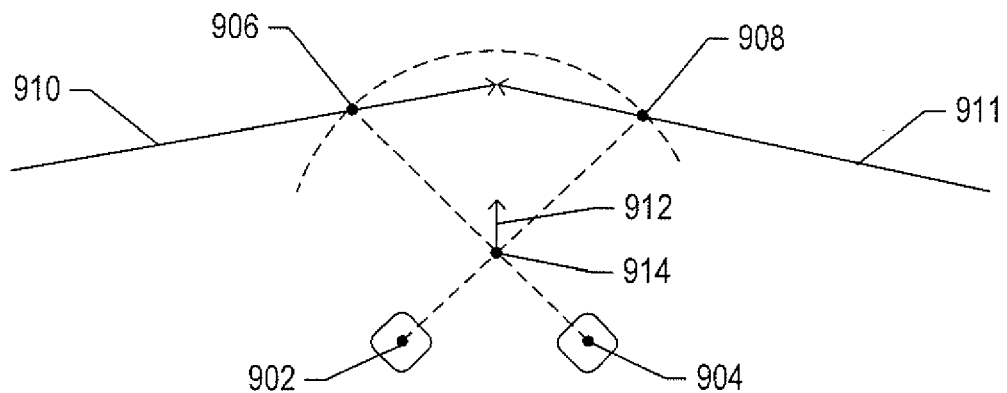
FIGS. 9A-D illustrate vibration modes in one implementation of the currently disclosed NLHA.
Figure 9B:
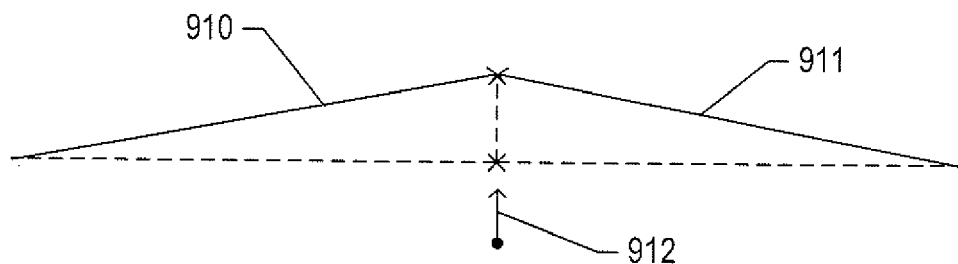
Figure 9C:
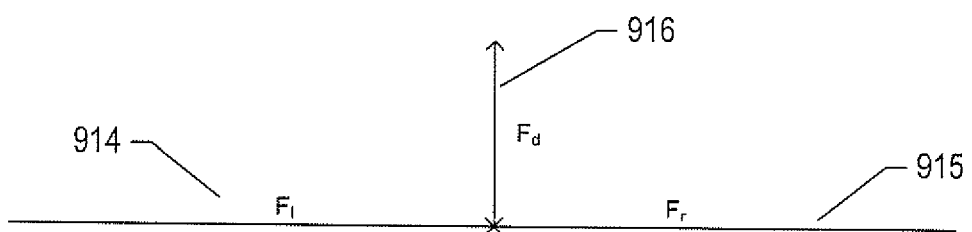

FIGS. 9A-D illustrate vibration modes in one implementation of the currently disclosed NLHA. In FIG. 9A, the configuration of the rotor, rotor suspension, and spring mechanism used in the currently disclosed NLHA is illustrated using illustration conventions similar to those used in FIGS. 8A-B. Points 902 and 904 represent the centers of the spring mounts viewed top-down. Points 906 and 908 represent points at which a line coincident with the spring edges intersect and are inscribed through the rotor. During oscillation of the rotor, the average forces generated by the rotor are represented by the three vectors 910-912. Vectors 910 and 911 are tangent to the arc over which the rotor oscillates while vector 912 points outward from the spring crossover point 914 towards the center of the rotor when the rotor is in the centered position shown in FIG. 8A. Vector 910 represents the force generated when the rotor reaches the extreme position 802 shown in FIG. 8A and reverses direction while vector 911 represents the force generated when the rotor reaches the extreme position 804 shown in FIG. 8A and reverses direction. Vector 912 represents the apparent centrifugal force generated as the rotor moves along the arc, equal and opposite to the centripetal force exerted by the springs to constrain motion of the rotor along the arc. As shown in FIG. 9B, vector 910 and vector 911 can each be resolved into a pair of vectors, one vector of each pair parallel to vector 912 and the other vector of each pair orthogonal to vector 912. Following straightforward vector addition of the vectors parallel to vector 912 and vector 912, the three resolved force vectors 914-916 are produced, as shown in FIG. 9C. These represent the directions of the time-averaged vibrational modes generated by oscillation of the rotor over an arc about the crossover point of the two springs. The vibrational forces produced by the NLHA oscillate back and forth along a line segment parallel to vectors 914 and 915 and, in addition, oscillate up and down along the line segment parallel to vector 916. In general, as shown in FIG. 9C, the primary vibrational mode is parallel to the line segment coincident with vectors 914 and 915, while the secondary vibrational mode is orthogonal to the primary vibrational mode. Different configurations, relative component weights, and other variations of the rotor, rotor suspension, and spring mechanism used in the currently disclosed NLHA may produce different relative magnitudes of the vibrational forces produced along the two vibrational modes.

Figure 9D:
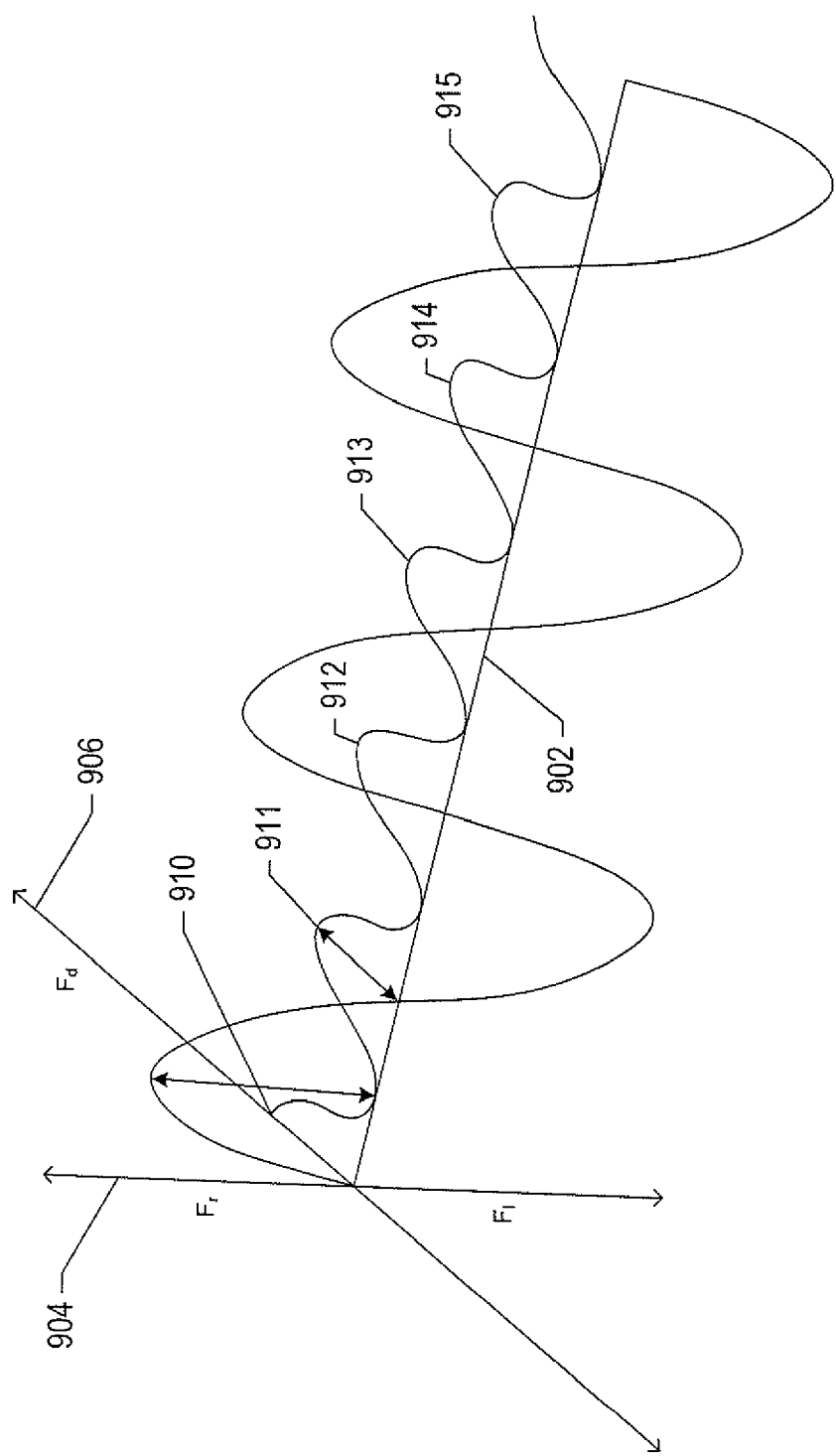

FIG. 9D illustrates the vibrational forces produced by the currently disclosed NLHA. In FIG. 9D, axis 902 represents time, axis 904 represents the primary vibrational mode, and access 906 represents the secondary vibrational mode. The amplitude of the primary vibrational mode is shown to be significantly greater than that of the secondary vibrational mode in FIG. 9D. Furthermore, the period of the primary vibrational mode is one half the period of the secondary vibrational mode. The secondary vibrational mode produces a maximal force, at points 910-915, when the primary vibrational mode produces minimal forces. Of course, the amplitudes, periods, and other parameters of the vibrational forces generated by the currently disclosed NLHA depend on the configuration, component weights, spring constants of the springs, and other such parametric characteristics of the rotor, rotor suspension, and spring mechanism. In general, because of the elimination of the majority of frictional forces from the NLHA rotor, rotor suspension, and spring mechanism, the NLHA is characterized by relatively high peak-height-to-peak-width vibrational-force ratios and efficient conversion of power to vibrational force.

FIGS. 10A-C illustrate one implementation of the unbalanced rotor, rotor suspension, and spring mechanism used in the currently disclosed NLHA. FIG. 10A illustrates the rotor suspension and spring mechanism, along with oscillation-drive components, but without the rotor masses. The two springs with asymmetric profiles 1002 and 1004 are mounted on spring mounts 1006 and 1008, respectively, and are coupled to a platform 1010 onto which wedge-shaped rotor weights are mounted, as discussed below. Two permanent magnets, including permanent magnet 1012, are mounted at the edge of the platform 1012 to the top and bottom surfaces of the platform or to the rotor weights. A coil 1014 is independently mounted in the position shown in FIG. 10A to provide alternating magnetic forces to drive oscillation of the rotor, in similar fashion to the driving components of the LRVM, discussed above with reference to FIGS. 8A-B. FIG. 10B shows the rotor, rotor suspension, and spring mechanism with mounted wedge-shaped rotor weights, including top rotor weight 1016 and lower rotor weight 1018. FIG. 10C shows a top-down view of the rotor, rotor suspension, and spring mechanism.

Figure 11C:
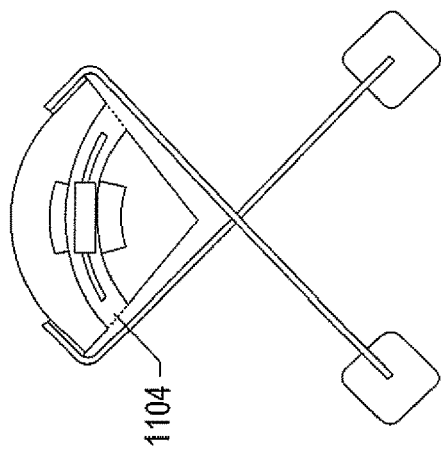
FIGS. 11A-C illustrate a second implementation of the unbalanced rotor, rotor suspension, and spring mechanism used in the currently disclosed NLHA.
Figure 11A:
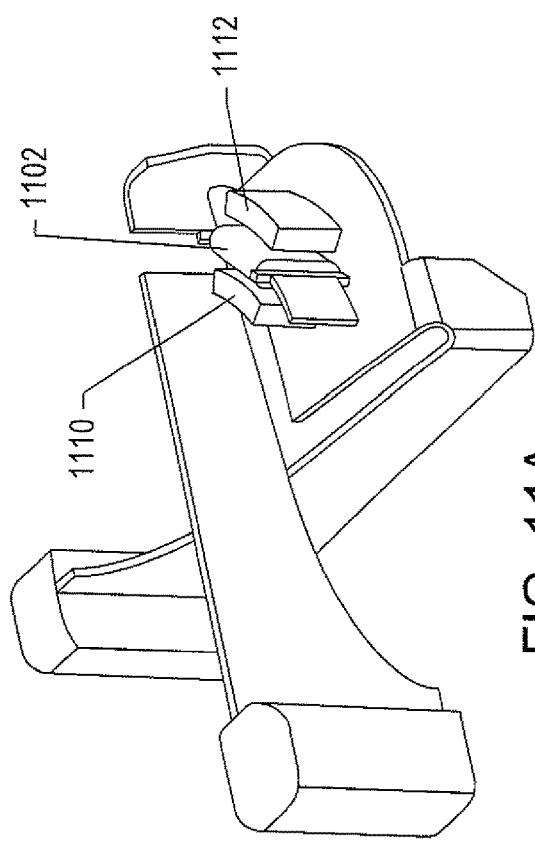
Figure 11B:
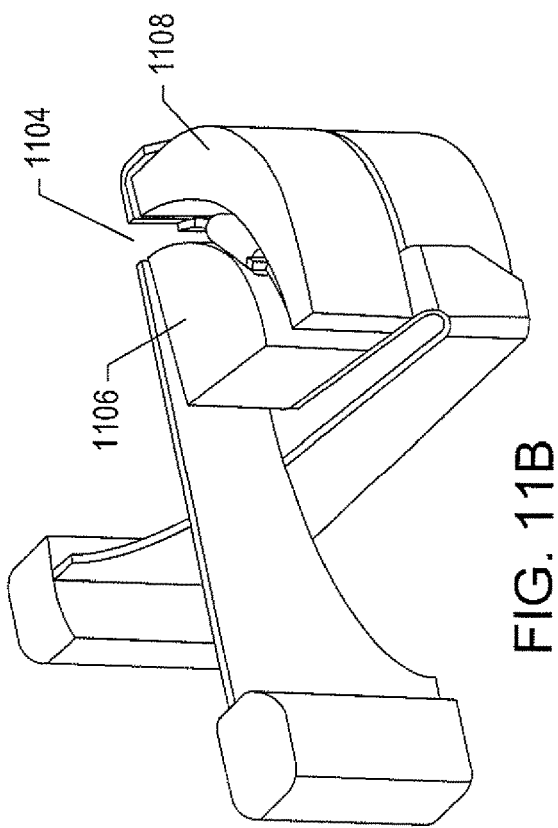

FIGS. 11A-C illustrate a second implementation of the unbalanced rotor, rotor suspension, and spring mechanism used in the currently disclosed NLHA. In this implementation, the coil 1102 that drives oscillation of the rotor is independently mounted within a channel 1104 between two parts 1106 and 1108 of the top rotor weight. The permanent magnets 1110 and 1112 are incorporated into the 2 portions of the top rotor weight 1106 and 1108. There are, of course, many additional variations and configurations that can be used to generate many additional implementations of the rotor, rotor suspension, and spring mechanism used in the currently disclosed NLHA.

Figure 12:
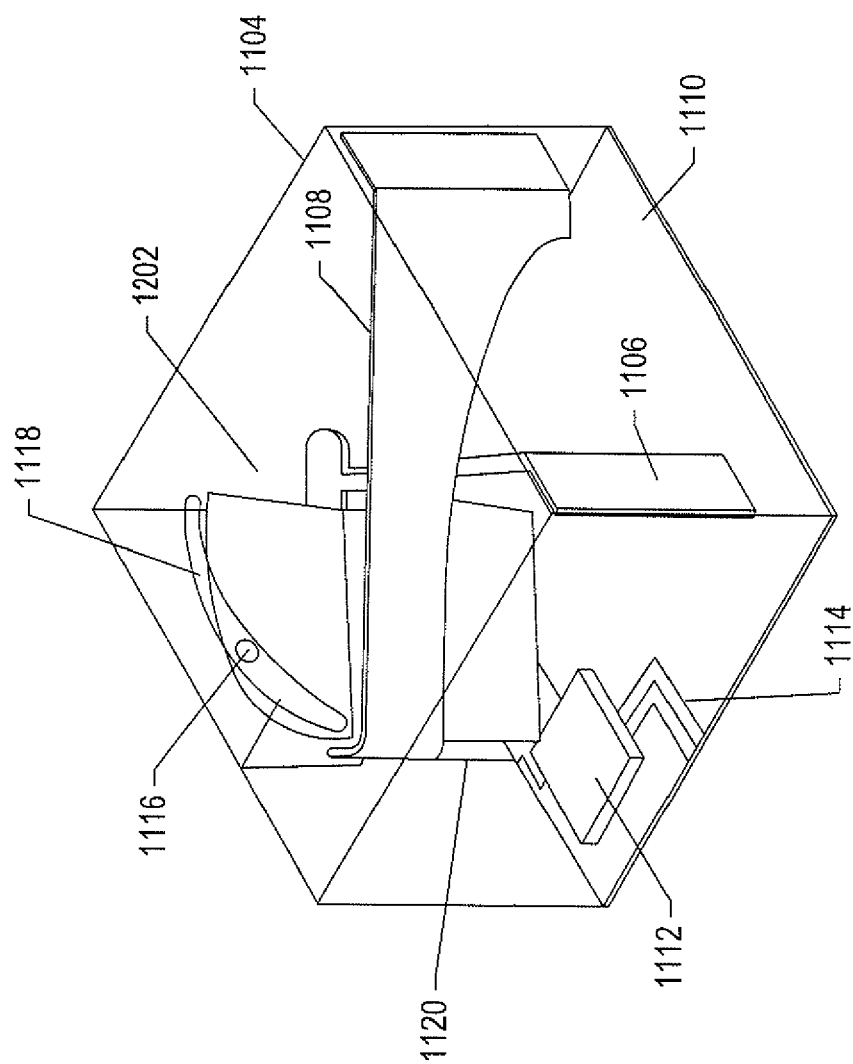
FIG. 12 illustrates one implementation of the currently disclosed NLHA.

FIG. 12 illustrates one implementation of the currently disclosed NLHA. In this implementation, the unbalanced rotor, rotor suspension, and spring mechanism 1202 is incorporated within a rectangular box-like housing 1104. The two springs 1106 and 1108 are welded or otherwise permanently affixed to the inner surface of a vertical wall 1110 of the housing. A microprocessor 1112 is mounted on the floor of the housing, below the rotor, rotor suspension, and spring mechanism. Input signal lines 1114 provide power and control instructions to the microprocessor, and the microprocessor controls transmission of current with alternating polarities to the coil, discussed above with reference to FIGS. 10A-11C, to drive rotor oscillation. In addition, a small permanent magnet 1116 is mounted to the top of the wedge-shaped rotor weight, the position of which is continuously monitored by a sensor 1118 that provides a rotor-position signal 1120 to the microprocessor that the microprocessor uses to adjust control of the rotor, rotor suspension, and spring mechanism to produce desired oscillation frequencies and desired vibrational forces.

The present invention has been described in terms of particular embodiments, it is not intended that the invention be limited to these embodiments. Modifications within the spirit of the invention will be apparent to those skilled in the art. For example, although the currently disclosed NLHA can be implemented in many different dimensional ranges, many implementations are designed to have dimensions on the order of millimeters to one or a few centimeters. In the above-discussed implementations, permanent magnets are mounted to or within the rotor, but, in alternative implementations, electromagnets may be used, powered through the metallic springs. Current implementations provide oscillation frequencies in the 100 to 130 Hz range, but, by changing the configuration, dimensions, spring materials, component weights, and other such parameters, oscillation frequencies from below 20 Hz to greater than 250 Hz may be achieved. In current implementations, driving currents of around 30 mA at 3 V are employed, with, around 10 ms start times and 50 ms start times, although, as with other parameters, these parameters may vary depending on the various above-mentioned design parameters. In current implementations, the springs are fabricated from a beryllium-copper alloy, but other types of spring materials are used in alternative implementations, including other types of metal alloys, a titanium alloy, as well as various types of composite and polymeric materials, silicon, graphene and carbon-nanotube containing materials, and other flexible materials that provide sufficient rigidity to suspend the rotor within the housing. In certain implementations, each spring may include two or more layers of the same or different compositions fused together by welding or various layer-annealing processes. In general, the frequency range of an NLHA and the magnitude of the vibrational forces produced by the NLHA greatly depend on the dimensions and composition of the springs. In alternative implementations, a printed circuit board housing floor may include printed coils to drive oscillation of the rotor. A variety of sophisticated feedback-controlled control programs may be executed by the microprocessor included within, or external to, the housing to generate a wide variety of different types of vibrational responses from the NLHA, including various types of vibrational patterns that change over time, vibration responses that maximize vibrational forces, and other types of vibrational responses. Any of many different materials can be used for the rotor weights, with the materials generally selected based on density as well as resilience to deterioration or shape change during rotor oscillation.

The invention claimed is:

1. A haptic actuator comprising:
   a housing; and
   a moving component comprising:
      a mass component; and
      a plurality of springs, the plurality of springs being configured to collectively enable the mass component to oscillate along an arc-shaped path via alternating magnetic forces from a coil adjacent to the mass component to produce an unbalanced vibrational force;
      wherein the plurality of springs are disposed non-orthogonally to each other and so as to allow each of the plurality of springs to cause the oscillation without contacting the housing nor each other; and
      wherein the mass component is suspended exclusively by the plurality of springs.

2. The haptic actuator of claim 1, wherein the plurality of springs are disposed relative to each other with a clearance between the plurality of springs.

3. The haptic actuator of claim 1, wherein the plurality of springs are associated with a crossover point with respect to each other.

4. The haptic actuator of claim 1, wherein at least one of the plurality of springs comprises an asymmetric profile, the asymmetric profile comprising substantially parallel first and second edges having different respective lengths, a third edge substantially orthogonal to the first and second edges, and a fourth edge having at least a curved portion.

5. The haptic actuator of claim 1, wherein the coil is mounted proximate to an edge of a suspension component, and disposed adjacent to at least one magnet component, the at least one magnet component being mounted at the edge of the suspension component;
   wherein the suspension component is configured to suspend the mass component within the housing so as to facilitate the oscillation of the mass component along the arc-shaped path.

6. The haptic actuator of claim 5, wherein the coil is mounted on a surface of the suspension component, the coil being disposed adjacent to one or more magnet components, the one or more magnet components being mounted on the surface of the suspension component.

7. The haptic actuator of claim 6, wherein:
   the moving component comprises a plurality of mass components, each of the plurality of mass components incorporating at least one of the one or more magnet components;
   a first of the plurality of mass components is disposed proximate a first side of the coil;
   a second of the plurality of mass components being disposed proximate a second side of the coil.

8. The haptic actuator of claim 1, wherein the oscillation along the arc-shaped path comprises an oscillation which does not circumscribe a complete circle.

9. The haptic actuator of claim 1, wherein the oscillation along the arc-shaped path comprises an oscillation which is bounded by an angle defined by first and second boundaries, the angle less than 360-degrees.

10. The haptic actuator of claim 1, wherein the oscillation along the arc-shaped path comprises an oscillation which does not maintain a constant radius relative to any prescribed point of the haptic actuator.

11. A reduced friction haptic actuator comprising:
   at least two masses; and
   at least two springs, each spring (i) affixed to a respective spring mount at a first end of the spring and (ii) coupled to respective one of the at least two masses at a second end of the spring, the spring comprising a sole means of support for the respective mass coupled to the spring;
   wherein each spring of the at least two springs is configured to actuate the respective mass at the second end of the spring and remain stationary at the spring mount, the actuation of the respective mass comprising oscillation of the respective mass between ends of a first arc segment at the second end of the spring, the oscillation being caused by alternating magnetic forces from a coil, the coil being disposed proximate the respective mass.

12. The reduced friction haptic actuator of claim 11, wherein:
   each of the at least two masses comprises a permanent magnet; and
   the coil is disposed between the at least two masses.

13. The reduced friction haptic actuator of claim 11, wherein the at least two springs are arranged such that respective planes extending from the at least two springs interact at a crossover portion.

14. The reduced friction haptic actuator of claim 13, wherein:
   the respective spring mounts have a second arc segment associated therewith; and
   a distance between the crossover portion and the second arc segment is different from a distance between the crossover portion and the first arc segment.

15. The reduced friction haptic actuator of claim 11, wherein each of the at least two springs comprises a rectangular side profile or an asymmetric side profile, the rectangular side profile comprising two pairs of parallel edges, the asymmetric side profile comprising one pair of parallel edges.

16. A haptic actuator comprising:
   a housing; and
   a moving component comprising:
      a mass component;
      at least one spring mount; and
      a plurality of springs, the plurality of springs each being mounted using the at least one spring mount, and configured to collectively enable the mass component to oscillate along an arc-shaped path via alternating magnetic forces from at least a coil adjacent to the mass component to produce an unbalanced vibrational force, each of the plurality of springs comprising an asymmetric profile configured to at least reduce a concentration of oscillation-induced stress in a region proximate to the at least one mount;
   wherein the plurality of springs are disposed so as to allow each of the plurality of springs to cause the oscillation without contacting the housing nor each other; and
   wherein the mass component is suspended exclusively by the plurality of springs.

* * * * *